US010189249B2

(12) United States Patent
Taniguchi et al.

(10) Patent No.: US 10,189,249 B2
(45) Date of Patent: Jan. 29, 2019

(54) RECORDING ELEMENT SUBSTRATE, LIQUID DISCHARGE HEAD, AND RECORDING APPARATUS

(71) Applicant: CANON KABUSHIKI KAISHA, Tokyo (JP)

(72) Inventors: Suguru Taniguchi, Kawasaki (JP); Toshio Negishi, Yokohama (JP); Kazunari Fujii, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/895,949

(22) Filed: Feb. 13, 2018

(65) Prior Publication Data

US 2018/0236761 A1    Aug. 23, 2018

(30) Foreign Application Priority Data

Feb. 22, 2017   (JP) .................................. 2017-031357

(51) Int. Cl.
*B41J 2/175*     (2006.01)
*B41J 2/045*     (2006.01)

(52) U.S. Cl.
CPC ......... *B41J 2/04541* (2013.01); *B41J 2/0455* (2013.01); *B41J 2/04523* (2013.01); *B41J 2/17546* (2013.01)

(58) Field of Classification Search
CPC .. B41J 2/04541; B41J 2/0455; B41J 2/17546; B41J 2/04523
See application file for complete search history.

(56) References Cited

U.S. PATENT DOCUMENTS

| 2005/0285904 | A1* | 12/2005 | Toge | B41J 2/14072 347/58 |
| 2007/0008382 | A1* | 1/2007 | Hatsui | B41J 2/04541 347/61 |
| 2007/0091131 | A1* | 4/2007 | Hatsui | B41J 2/14072 347/11 |
| 2007/0103501 | A1* | 5/2007 | Hatsui | B41J 2/14072 347/20 |
| 2014/0078223 | A1* | 3/2014 | Ohmura | B41J 2/14016 347/56 |
| 2018/0236761 | A1* | 8/2018 | Taniguchi | B41J 2/04541 |

FOREIGN PATENT DOCUMENTS

JP          2014-058130 A       4/2014

* cited by examiner

*Primary Examiner* — Julian D Huffman
(74) *Attorney, Agent, or Firm* — Canon USA Inc., IP Division (57) ABSTRACT

A recording element substrate includes a recording module including a plurality of recording elements and first logic circuits corresponding to the plurality of recording elements, a memory module including a plurality of memory elements and second logic circuits corresponding to the plurality of memory elements, and a common line configured to connect a signal supply circuit to the plurality of first logic circuits and the plurality of second logic circuits in common. The recording elements are arranged along an extending direction in which the common line extends, and the memory modules are disposed between the common line and the recording elements.

20 Claims, 9 Drawing Sheets

RECORDING ELEMENT SUBSTRATE, LIQUID DISCHARGE HEAD, AND RECORDING APPARATUS

BACKGROUND OF THE DISCLOSURE

Field of the Disclosure

The present disclosure relates to a recording element substrate which includes memory elements and which is used to perform recording, a liquid discharge head including the recording element substrate, and a recording apparatus which performs recording using the liquid discharge head.

Description of Related Art

A poly fuse memory is generally used as a one time programmable (OTP) read only memory (ROM) which records unique information, such as a product ID or a setting parameter. A poly fuse memory generally includes recording element substrates mounted on liquid discharge heads, and the desired unique information is stored in the heads. Poly silicon which forms a gate wiring or a resistance element of a transistor is used for the poly fuse memory, and has an advantage in that a memory is formed on a recording element substrate without additionally performing an existing semiconductor production process. As a reading/writing principle of the poly fuse memory, poly silicon wiring is fused for disconnection by heat generated due to a flow of current and a change of a resistance value is detected so as to be used as a memory.

The poly fuse memory requires a large control transistor which drives large current in a degree that the poly silicon wiring is fused for disconnection, and has a large area occupied by an element group (hereinafter also referred to as a "memory module") required for function of 1 bit of a memory. However, the number of memory bits required for a product is generally 32 to 48 bits, and therefore, an occupied area in the recording element substrate is approximately 5% or less.

In recent years, in addition to unique information, such as a product ID or a setting parameter, a state of aging effect at a time of use, such as a recording material use amount, is required to be recorded inside a recording head for the purpose of higher accuracy control performed by a recording apparatus. Therefore a large amount of memory (for example, approximately 128 bits or more) is required.

Therefore, as a memory which realizes a memory module smaller than that of the poly fuse memory, Japanese Patent Application Laid-Open No. 2014-58130 discloses an anti-fuse memory (memory element). The anti-fuse memory has an advantage in that the anti-fuse memory may be generated by a general semiconductor production process without additionally performing a special process. The anti-fuse memory is formed by a gate oxide film of an MOS transistor, and an overvoltage is applied to the gate oxide film for short-circuit so that a change of a characteristic of the gate oxide film is used as a memory.

For example, in a case where an anti-fuse memory is used as a memory element, a logic circuit for the memory element which receives a signal transmitted from a signal supply circuit is provided to select a memory in which information is written.

If the number of memory elements mounted on a recording element substrate is increased, a region for mounting logic circuits corresponding to the memory elements and wiring for supplying signals to the logic circuits is also increased in addition to a region for mounting the memory elements. Accordingly, an area of the recording element substrate may be disadvantageously increased.

SUMMARY OF THE DISCLOSURE

The present disclosure suppresses the increase of an area of a recording element substrate in accordance with an increase of the number of memory elements.

According to an embodiment of the present disclosure, a recording element substrate includes a recording module including a plurality of recording elements and first logic circuits corresponding to the plurality of recording elements, a memory module including a plurality of memory elements and second logic circuits corresponding to the plurality of memory elements, a signal supply circuit configured to supply a signal for controlling the recording elements and a signal for controlling the memory elements, and a common line configured to connect the signal supply circuit to the plurality of first logic circuits and the plurality of second logic circuits in common. The recording elements are arranged along an extending direction in which the common line extends, and the memory modules are disposed between the common line and the recording elements.

Further features of the present disclosure will become apparent from the following description of exemplary embodiments with reference to the attached drawings.

DESCRIPTION OF THE EMBODIMENTS

Recording Apparatus, Recording Head Unit, and Recording Head

Figure 7A:
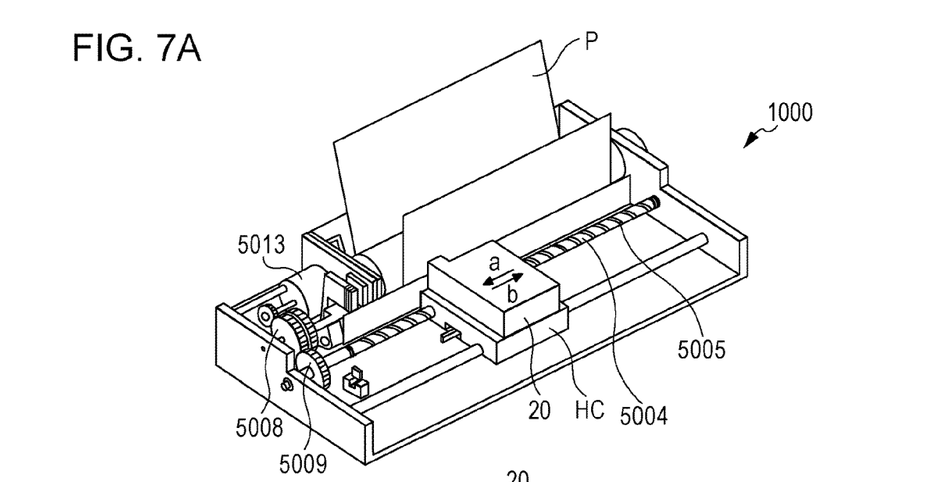
FIGS. 7A, 7B, and 7C are diagrams schematically illustrating a recording head including a recording element substrate mounted thereon and an exemplary recording apparatus including the recording head mounted thereon.

According to the present disclosure, FIG. 7A is a perspective view schematically illustrating an exemplary recording apparatus 1000 which includes a recording head unit 20 mounted thereon. As illustrated in FIG. 7A, a lead screw 5004 rotates in cooperation with positive and negative rotations of a driving motor 5013 through driving force transmission gears 5008 and 5009. A carriage HC, which may include the recording head unit 20 mounted thereon, includes a pin (not illustrated) engaged with a helical channel 5005 of the lead screw 5004, and is moved linearly in a reciprocating manner in directions denoted by arrow marks a and b when the lead screw 5004 rotates.

Figure 7B:
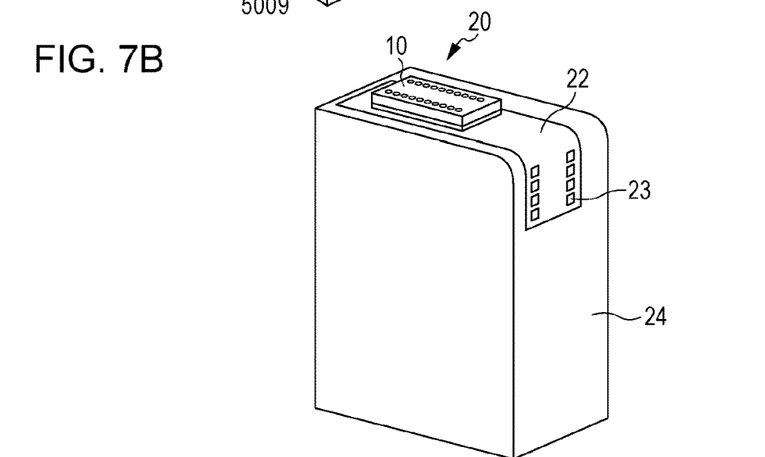

FIG. 7B is a perspective view illustrating the recording head unit 20 including a recording head 10 according to the present disclosure. The recording head unit 20 includes the recording head 10 and a cassette 24 which accommodates recording material to be supplied to the recording head 10 which are integrally configured as a cartridge. The recording head 10 is mounted on a surface which faces a recording medium P (illustrated in FIG. 7A). Note that it is not necessarily the case that the recording head 10 and the cassette 24 are integrally configured, and the cassette 24 may be detachable. The recording head unit 20 includes a tape member 22. The tape member 22 includes a terminal used to supply electric power to the recording head 10 and transmits/receives (conducts) electric power and various signals to/from a recording apparatus body through contacts 23.

Figure 7C:
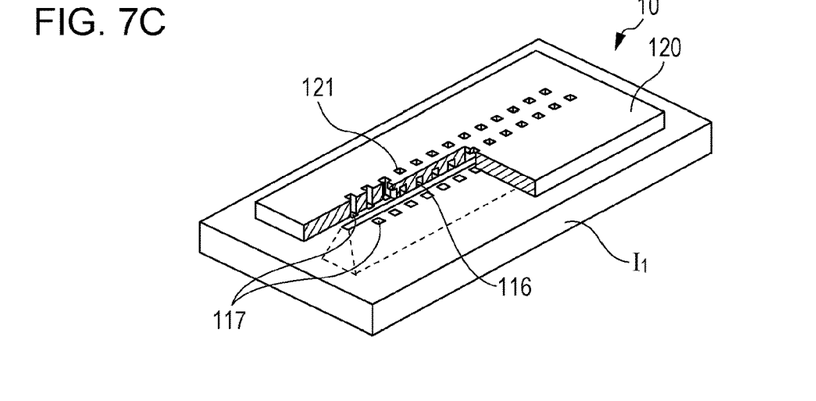

FIG. 7C is a perspective view schematically illustrating the recording head 10 according to the present disclosure. The recording head 10, as a liquid discharge head, includes a recording element substrate $I_1$ and a channel forming member 120. The recording element substrate $I_1$ includes thermal action portions 117 which are arranged in a plurality of lines and which apply thermal energy generated by electro-thermal transducing element to the recording material. Furthermore, the channel forming member 120 also serves as a discharge port member in which discharge ports 121 which discharge the recording material are arranged in a plurality of lines so as to correspond to the thermal action portions 117. When electric power and signals are supplied from the recording apparatus body to the recording element substrate $I_1$ through the tape member 22 and thermal energy generated when the electro-thermal transducing element is driven is applied to the recording material (liquid) through the thermal action portions 117, the recording material is discharged from the discharge ports 121.

Recording Element Substrate

Figure 1:
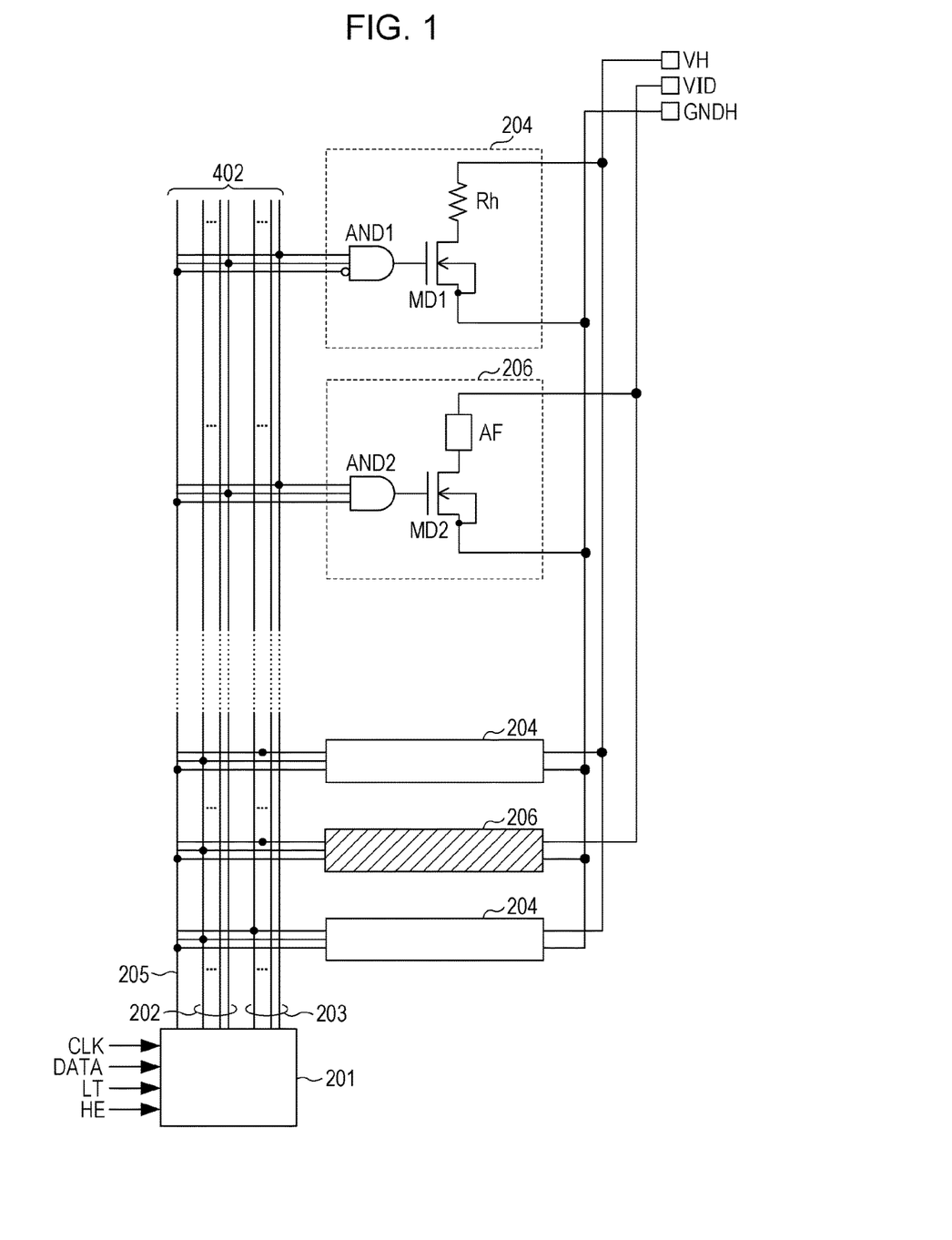
FIG. 1 is a diagram illustrating a circuit configuration of a portion of a recording element substrate according to a present disclosure.
Figure 2:
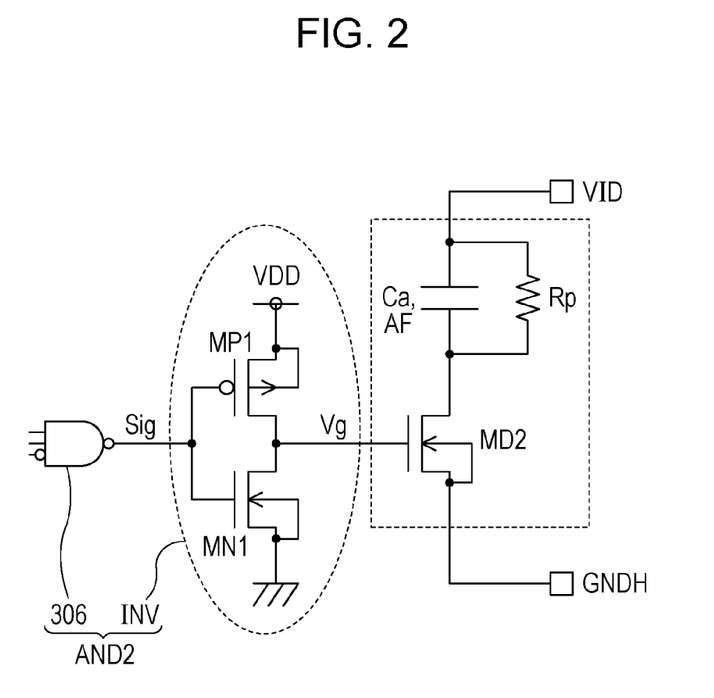
FIG. 2 is a diagram illustrating a configuration of a memory module applicable to the recording element substrate according to the present disclosure.
Figure 3:
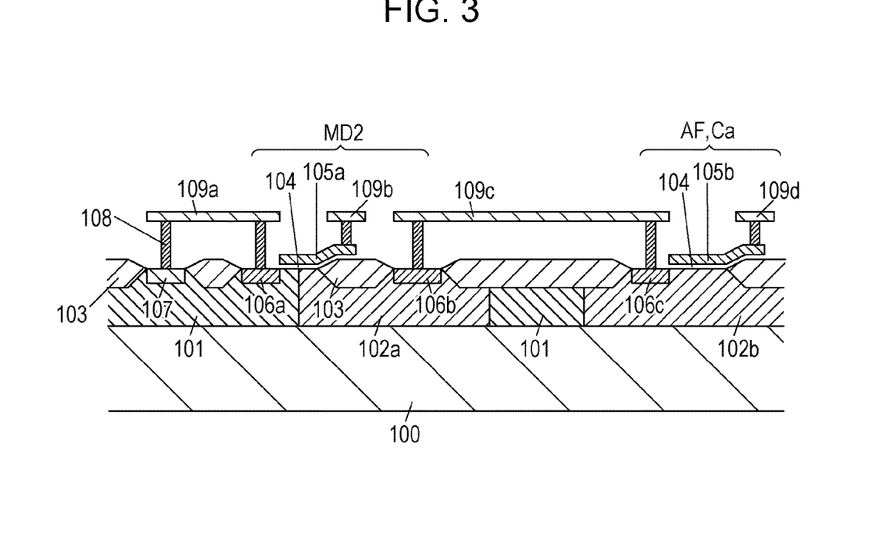
FIG. 3 is a cross-sectional view schematically illustrating the configuration of the memory module according to the present disclosure.

Referring to FIGS. 1 to 3 of the present disclosure, circuit configurations of a discharge module (a recording module) and a memory module will be described. The discharge module (recording module) and the memory module are mounted on a recording element substrate (hereinafter simply referred to as a "substrate" where appropriate).

FIG. 1 is a diagram illustrating a circuit configuration of a portion of the recording element substrate $I_1$. The recording element substrate $I_1$ includes discharge modules 204 and memory modules 206. Each of the discharge modules 204 includes a recording element Rh (an electro-thermal transducing element, for example), a driving element (transistor) MD1 for a recording element which drives the recording element Rh, and a logic circuit AND1 for selection of a recording element. The recording material, such as ink, is discharged by driving the recording element Rh so that recording is performed.

Furthermore, each of the memory modules 206 includes an anti-fuse (AF) element serving as a memory element, a driving element MD2 for a memory element which writes information in the anti-fuse element AF, and a logic circuit AND2 for selection of a memory element. The anti-fuse element AF fixedly holds information when overvoltage is supplied, and specifically, the anti-fuse element AF functions as a one-time programmable memory. That is, the anti-fuse element AF can be programmed only once.

Note that, although a configuration in which the plurality of discharge modules 204 each of which includes one recording element Rh are arranged is illustrated in FIG. 1, the plurality of discharge modules 204 may be simply referred to as a "discharge module". The same is true of the memory modules 206, and the plurality of memory modules 206 may be simply referred to as a "memory module".

Driving of the recording element Rh and the anti-fuse element AF is controlled in accordance with logical data transmitted from a control data supply circuit 201 serving as a signal supply circuit. The control data supply circuit 201 includes a shift register and a latch circuit, not illustrated, for example. Logical data signals, such as a clock signal CLK, an image data signal DATA, a latch signal LT, and a recording element control signal HE, may be supplied to the control data supply circuit 201 through a body of the recording apparatus 1000, a host PC, not illustrated, or the like. Furthermore, a first power source voltage VDD (3 to 5V, for example) is supplied as a logic power source voltage to the logic circuit AND1, the logic circuit AND2, and the control data supply circuit 201.

Here, the control data supply circuit 201 controls operation of the discharge modules 204 for each group in m groups each of which includes n discharge modules 204 so as to enable time divisional driving for driving the recording elements Rh. The control data supply circuit 201 outputs a block selection signal 202 of m bits and a time divisional selection signal 203 of n bits. The control data supply circuit 201 further outputs at least a switching signal 205 of 1 bit for performing switching between a recording element and a memory element. Each of the discharge modules 204 receives at least the block selection signal 202 of 1 bit, at least the time divisional selection signal 203 of 1 bit, and at least the switching signal 205 of 1 bit so that the recording element Rh is subjected to the time divisional driving.

Furthermore, the control data supply circuit 201 controls operation of the memory modules 206 for each group in y groups each of which includes x memory modules 206 so as to enable time divisional driving for driving the anti-fuse elements AF. Each of the memory modules 206 receives at least the block selection signal 202 of 1 bit, at least the time divisional selection signal 203 of 1 bit, and at least the switching signal 205 of 1 bit which are output from the control data supply circuit 201 so that the anti-fuse element AF is subjected to the time division driving. One of the anti-fuse elements AF included in the memory modules 206 to which information is to be written may be determined by the block selection signal 202, the time divisional selection signal 203, and the switching signal 205 based on the signals CLK, DATA, LT, and HE.

Note that the discharge modules 204 and the memory modules 206 are exclusively driven by the switching signal 205 so that all the recording elements Rh and all the anti-fuse elements AF are not driven in the same period of time. Specifically, the switching signal 205 is used to switch driving so that the recording elements Rh or the anti-fuse elements AF are driven. In a case where the switching signal 205 is 1 bit, the relationship between the number x of memory modules 206 and the number n of time divisional selection signals included in one memory group is denoted by "x≤n" and the relationship between the number y of memory groups and the number m of block selection signals is denoted by "y≤m". Furthermore, the switching signal 205 of several bits may be provided so that a number (n×m) of anti-fuse elements AF or more can be controlled.

The logic circuit AND1 receives the corresponding block selection signal 202, the corresponding time divisional selection signal 203, and the switching signal 205. The driving element MD1 for a recording element is brought to a conductive state in response to the input signals, and the recording element Rh which is connected to the driving element MD1 for a recording element in series is driven.

Here, as the driving element MD1 for a recording element, a double-diffused metal-oxide semiconductor field-effect transistor (MOSFET) (DMOS) transistor which is a high-voltage tolerant MOS transistor, for example, is used. When the anti-fuse element AF is used as the memory element, in general, a driving current of the memory element is smaller than a driving current of the recording element, and only small current driving capability is required for the DMOS transistor. Accordingly, an area of the driving element MD2 for a memory element may be smaller than an area of the driving element MD1 for a recording element Rh.

Furthermore, as the logic circuit AND1 for selection of a recording element Rh, a MOS transistor is used, for example. Here, a second power source voltage VH (24V, for example) is supplied as a power source voltage for driving of a recording element Rh to the discharge modules 204 and a ground potential is denoted by "GNDH".

Furthermore, the logic circuit AND2 for selection of a memory element receives the corresponding block selection signal 202, the corresponding time divisional selection signal 203, and the switching signal 205. A signal corresponding to the input signals is output to the driving element MD2 for a memory element, and a conductive state or a non-conductive state of the driving element MD2 is switched. As the driving element MD2 for a memory element, a DMOS transistor is used, for example, similarly to the driving element MD1 for a recording element.

Furthermore, as the logic circuit AND2 for selection of a memory element, a MOS transistor is used. Here, a third power source voltage VID (24V, for example) for writing information in the anti-fuse elements AF is supplied to the memory modules 206 and a ground potential is denoted by "GNDH". As illustrated in FIG. 1, the driving element MD1 for a recording element and the driving element MD2 for a memory element may be connected to a common GNDH pad through a common ground line.

Note that, although a case where the power source voltages VID and VH are independent power source lines is described, when a smallest value of a voltage required for writing to the anti-fuse element AF is equal to or smaller than the power source voltage VH, the power source voltage VH may be used along with a step-down circuit, for example.

FIG. 2 is a diagram illustrating a configuration of the memory modules 206 used in the substrate $I_1$. In FIG. 2, the logic circuit AND2 for selection of a memory element is represented by a NAND circuit 306 and an inverter INV. The inverter INV includes a PMOS transistor MP1 and an NMOS transistor MN1, and a MOSFET transistor is used as the PMOS transistor MP1 and the NMOS transistor MN1. A signal Sig is input to the inverter INV, and a signal Vg is output to a gate of the driving element MD2 for a memory element.

Before information is written, the anti-fuse element AF may function as a capacitive element Ca, for example. In FIG. 2, a state before information is written in the anti-fuse element AF is illustrated, and the anti-fuse element AF is represented as a capacitor Ca.

The capacitor Ca as the anti-fuse element AF has one terminal connected to the driving element MD2 for a memory element in series. Furthermore, the capacitor Ca has the other terminal to which a power source voltage VID is supplied when reading or writing is performed.

Furthermore, each of the memory modules 206 has a resistance element (having a resistance value Rp which is simply referred to as a "resistance element Rp" where appropriate hereinafter) which is connected to the anti-fuse element AF in parallel. By this, a case where information is mistakenly written in the anti-fuse element AF since overvoltage is applied to opposite ends of the anti-fuse element AF even though the driving element MD2 for a memory element is in a nonconductive state may be avoided.

FIG. 3 is a cross-sectional view of a portion of the recording element substrate $I_1$ including the capacitor Ca and the driving element MD2 for a memory element. For example, P-type well regions 101 and N-type well regions 102a and 102b are formed on a P-type silicon substrate 100. The P-type well regions 101 are formed simultaneously with a P-type well of the NMOS transistor MN1, and the P-type well and the P-type well regions 101 have the same impurity concentration distribution. The relationship between the N-type well regions 102a and 102b and an N-type well of the PMOS transistor MP1 is the same. Assuming that a breakdown voltage in a PN junction between the N-type well regions 102a and 102b and the P-type silicon substrate 100 is denoted by VB, VB is larger than VID so that breakdown does not occur in the PN junction when information is written. Therefore, the N-type well regions 102a and 102b are formed taking individual impurity concentrations into consideration.

In the P-type well regions 101 and the N-type well regions 102a and 102b, field oxide films 103, high concentration N-type diffusion regions 106a to 106c, and a high concentration P-type diffusion region 107 are formed. The field oxide films 103 have a LOCOS structure. The high concentration N-type diffusion regions 106a to 106c and the high concentration P-type diffusion region 107 may be formed simultaneously with high concentration diffusion regions for drains, sources, and bulks of the transistors MP1 and MN1. Furthermore, gate oxide films 104 included in the driving element MD2 and the capacitor Ca may be formed simultaneously with gate insulation films of the transistors MP1 and MN1. A gate electrode 105a of the driving element MD2 and an electrode 105b of the capacitor Ca used as the anti-fuse element AF are individually formed by poly silicon. The electrodes 105a and 105b may also be formed simultaneously with gate electrodes of the transistors MP1 and MN1.

A configuration of the driving element MD2 which is a high-voltage tolerant NMOS transistor will now be described. The gate electrode 105a is disposed through the gate oxide film 104 on the P-type well region 101 and the N-type well region 102a which are adjacent to each other. A region in which the P-type well region 101 and the gate electrode 105a overlap with each other serves as a channel region. The high concentration N-type diffusion region 106a is a source electrode, and the high concentration P-type diffusion region 107 is a back-gate electrode. The N-type well region 102a which extends in a lower portion of the gate electrode 105a is disposed as a drain electric field relaxing region. The high concentration N-type diffusion region 106b formed in the N-type well region 102a serves as a drain electrode. Furthermore, a drain side of the gate electrode 105a has a configuration in which the drain side runs on the field oxide film 103 formed in the N-type well region 102a, that is, a so-called offset configuration.

Accordingly, even when the driving element MD2 is in an OFF state, that is, even when a voltage of the gate electrode is GND and a voltage of the drain electrode increases to the high voltage VID, gate-drain voltage tolerance may be ensured.

Next, a configuration of the anti-fuse element AF (the capacitor Ca) will be described. The electrode 105b disposed on the N-type well region 102b through the gate oxide film 104 functions as an upper electrode of the anti-fuse element AF and the high concentration N-type diffusion region 106c functions as a lower electrode.

Although the high concentration N-type diffusion region 106c is formed only in an opening portion of the upper electrode in FIG. 3, the high concentration N-type diffusion region 106c may be formed on an entire lower portion of the upper electrode. Furthermore, although the lower electrode of the anti-fuse element AF is connected to the drain of the driving element MD2 in FIG. 3, the upper electrode may be connected to the drain of the driving element MD2 and the lower electrode may be connected to the high voltage VID.

Note that, although the capacitor Ca serving as the anti-fuse element AF is formed by the N well region and the poly silicon in FIG. 3, the present disclosure is not limited to this configuration and the capacitor Ca may be formed by a PMOS transistor.

Next, connection states of the individual electrodes will be described. A metal line 109a is connected to the source electrode and the back-gate electrode of the driving element MD2 through contact portions 108, and a GND potential is applied to the metal line 109a. A metal line 109b is connected to the gate electrode of the high-voltage tolerant NMOS transistor through a contact portion 108, and a signal Vg output from the inverter circuit illustrated in FIG. 2 is input to the metal line 109b. A metal line 109c is connected to the drain electrode of the driving element MD2 and the lower electrode of the anti-fuse element AF through a contact portion 108. A metal line 109d is connected to the upper electrode of the anti-fuse element AF through a contact portion 108, and the high voltage VID is applied to the metal line 109d when information is written. Note that the metal lines 109a to 109d and the electrodes are electrically connected to one another, and fabrication methods and configurations of the metal lines 109a to 109d and the individual electrodes are not limited.

Next, operation of the memory module 206 when information is written in the anti-fuse element AF will be described. When information is written in the anti-fuse element AF, a signal in a low level is input to the control signal Sig so that the driving element MD2 for a memory element is brought to an ON state. By this, the high voltage VID is applied to the gate oxide film of the anti-fuse element AF and the gate oxide film is broken so that information is written to the anti-fuse element AF. Specifically, although the anti-fuse element AF is the capacitor Ca before the information is written, the anti-fuse element AF is a resistance element after the information is written.

As a method for reading information written in the anti-fuse element AF, a method for measuring a change of an impedance of the anti-fuse element AF is employed, for example.

The information recorded in the anti-fuse element AF is information unique to a product, such as a chip ID or a setting parameter, and the information is written by an inspection machine or the like in a factory before shipping. Alternatively, when the information is written after the recording element substrate $I_1$ is mounted on a product body and a user starts use of the product, a voltage corresponding to the high voltage VID is supplied from the product body.

First Embodiment

Figure 4:
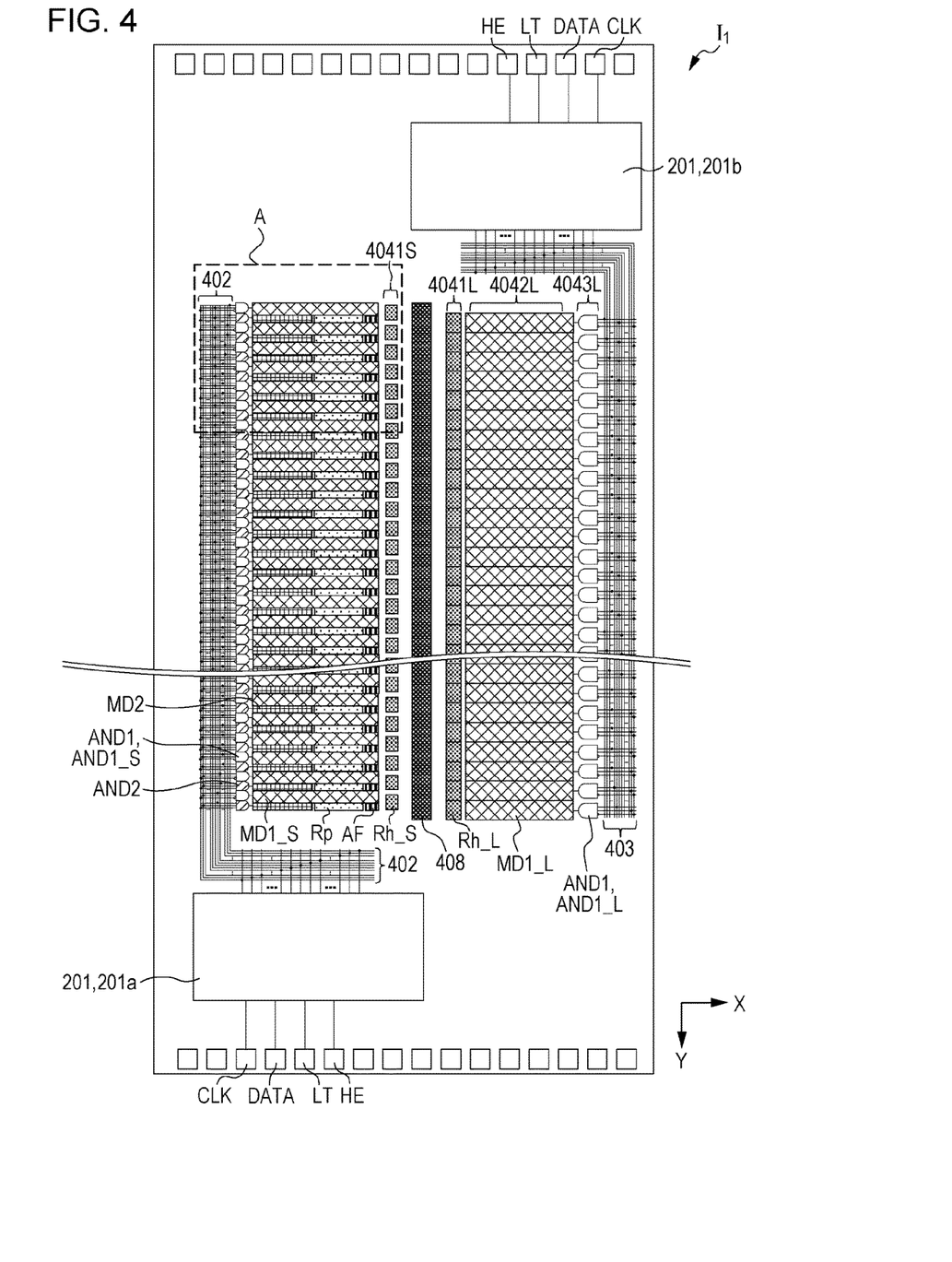
FIG. 4 is a plan view of a recording element substrate according to a first embodiment.
Figure 5:
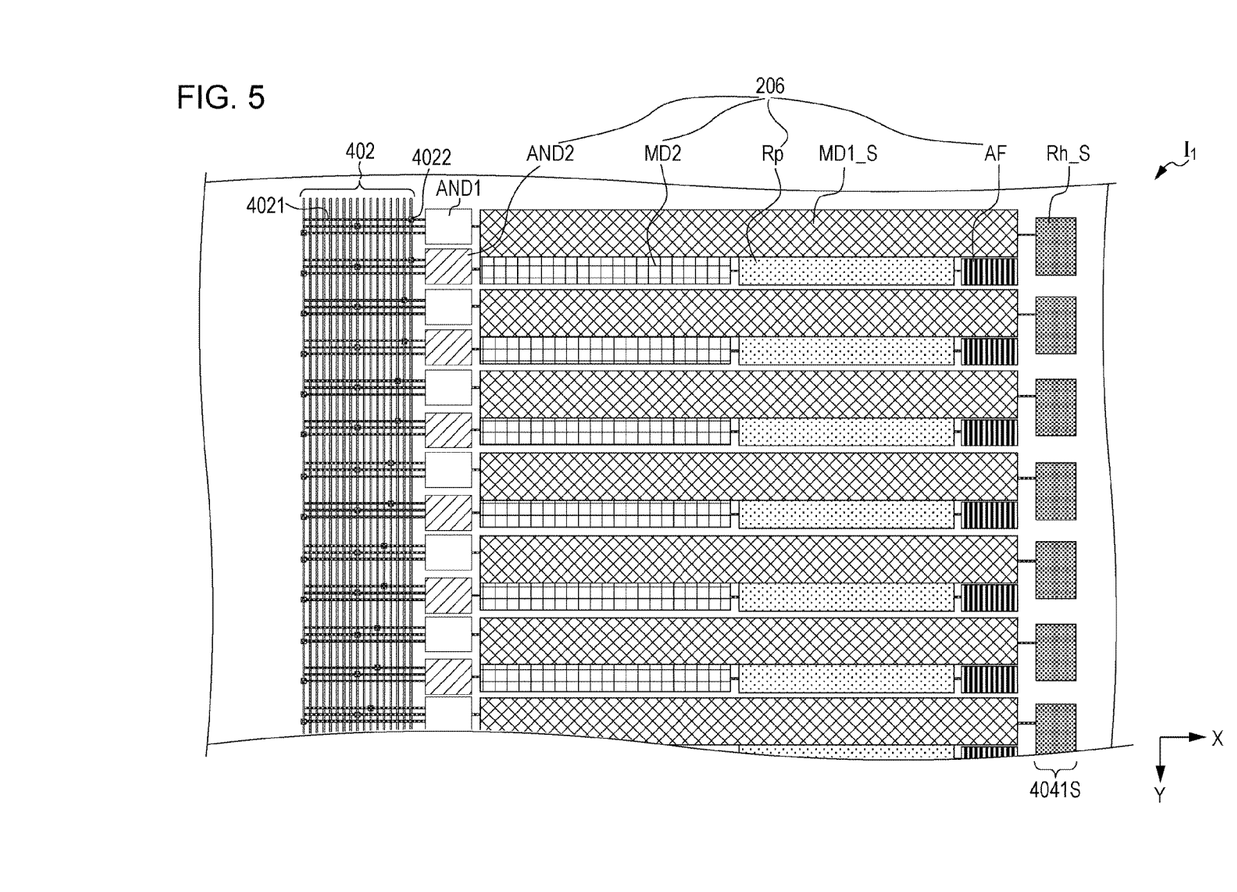
FIG. 5 is an enlarged view of a portion of the recording element substrate according to the first embodiment.

FIG. 4 is a plan view of the recording element substrate $I_1$ according to a first embodiment. FIG. 5 is an enlarged view of a region A surrounded by a dotted line in FIG. 4.

The substrate $I_1$ includes the recording elements Rh (Rh_L and Rh_S), the driving elements MD1 (MD1_L and MD1_S) for a recording element, and the logic circuits AND1 (AND1_L and AND1_S) for selection of a recording element. The substrate $I_1$ further includes the anti-fuse elements AF serving as memory elements, the driving elements MD2 for a memory element, and the logic circuits AND2 for selection of a memory element.

The substrate $I_1$ further includes a common logic bus line 402 (a common line) capable of supplying signals from the control data supply circuit 201 (201a) to the logic circuits AND1 (AND1_S) and AND2. In this embodiment, the common logic bus line 402 includes the block selection signal line 202, the time divisional selection signal line 203, and the signal line 205 for switching between a recording element and a memory element which are output from the control data supply circuit 201.

Note that the configuration of the common logic bus line 402 is not limited to the configuration including all the signal lines described above, and at least one of the signal lines extending from the control data supply circuit 201 is shared by the logic circuits AND1 for selection of a recording element and the logic circuits AND2 for selection of a memory element. When at least one of the signal lines is shared by the logic circuits AND1 and AND2, a region of the logic bus line 402 may be reduced.

In particular, the discharge modules 204 and the memory modules 206 may be exclusively driven in accordance with a signal supplied from the control data supply circuit 201 as described above in this embodiment. Specifically, all the recording elements Rh and all the anti-fuse elements AF are not simultaneously driven. Accordingly, different logic bus lines are not required for the recording elements Rh and the anti-fuse elements AF, and a region of the logic bus line connected to the control data supply circuit 201 may be further reduced.

Next, arrangement of the elements on the recording element substrate $I_1$ will be described. A supply port 408 which supplies liquid (recording material), such as ink, and which extends in a longitudinal direction of the substrate $I_1$ (a Y direction of FIG. 4) is disposed on the substrate $I_1$. A recording element array 4041L (a second recording element array) which is an array of recording elements Rh_L which discharge liquid of approximately 5 pl (a second amount) is disposed on a right side of the supply port 408. Furthermore, a driving element array 4042L which is an array of the driving elements MD1_L for a recording element corresponding to the recording elements Rh_L is disposed on a right side of the recording element array 4041L. Furthermore, a logic circuit array 4043L which is an array of the logic circuits AND1_L for selection of a recording element corresponding to the recording elements Rh_L is disposed on a right side of the driving element array 4042L. Furthermore, a logic bus line 403 dedicated for the recording elements Rh_L connected to the logic circuits AND1_L is disposed on a right side of the logic circuit array 4043L. The logic circuits AND1_L receive signals from the control data supply circuit 201 (201b) through the logic bus line 403. Note that the logic circuits AND2 for selection of a memory element are not connected to the logic bus line 403 in this embodiment.

A recording element array 4041S (a first recording element array) which is an array of recording elements Rh_S for discharging liquid of approximately 2 pl (a first amount) which is smaller than the amount of liquid discharged from the recording elements Rh_L is disposed on a left side of the supply port 408. Furthermore, a common logic bus line 402 extends in the Y direction in an edge portion on a left side (in a −X direction) in the substrate $I_1$ in FIG. 5. The logic circuits AND1_S for the recording elements Rh_S are connected to the common logic bus lines 402 and are arranged in the Y direction. Furthermore, the plurality of driving elements MD1 for the recording elements Rh_S which are connected to the logic circuits AND1_S and the recording elements Rh_S are arranged in the Y direction.

Note that the common logic bus line 402 extends in the Y direction, and the control data supply circuit 201 (201a) connected to the common logic bus line 402 is disposed in an end portion of the substrate $I_1$ in the Y direction.

Furthermore, memory modules 206 each of which includes the anti-fuse element AF, the driving element MD2 for a memory element, the logic circuit AND2 for selection of a memory element, and the resistance element Rp are disposed between the recording element array 4041S and the common logic bus line 402.

As illustrated in FIG. 5, the common logic bus line 402, the logic circuits AND1 for selection of a recording element, and the logic circuits AND2 for selection of a memory element are electrically connected to one another through discrete signal lines 4021 connected to input nodes of the logic circuits AND1 and AND2. The discrete signal lines 4021 extend in a direction which intersects to (orthogonal to, in this embodiment) a direction in which the common logic bus line 402 extends. The common logic bus line 402 and the discrete signal lines 4021 are formed in different wiring layers in a lamination direction of the substrate $I_1$ and electrically connected to each other through via holes 4022.

As described above and shown in FIG. 5, according to this embodiment, the plurality of memory modules 206 are arranged along a direction in which the common logic bus line 402 extends in a region between the recording element array Rh_S and the common logic bus line 402. Furthermore, the logic circuits AND1_S (first logic circuits) for the recording element array Rh_S and the logic circuits AND2 (second logic circuits) for the memory elements included in the memory modules 206 are connected to the common logic bus line 402. Specifically, the common logic bus line 402 is disposed as a common line shared by the discharge modules 204 and the memory modules 206. Accordingly, the memory modules 206 may be efficiently arranged on the substrate $I_1$, and increase of an area of the substrate $I_1$ caused by increase of the number of the memory elements may be suppressed.

Furthermore, the logic circuits AND2 are disposed between the adjacent logic circuit AND1_S in the Y direction in this embodiment. Accordingly, a portion of the common logic bus line 402 which is used as a dedicated line for the discharge modules 204 or the memory modules 206 may be reduced. Accordingly, increase of a region occupied by the logic bus line in the substrate may be suppressed even when the number of memory elements mounted on the substrate is increased, and therefore, increase of the area of the substrate caused by the increase of the number of memory elements may be further suppressed.

Note that, as illustrated in FIG. 5, at least portions of the logic circuits AND1 and AND2 preferably overlap with each other in the Y direction. Accordingly, a length of the substrate $I_1$ in the X direction may be reduced.

Furthermore, the case where the number of discharge modules 204 and the number of memory modules 206 which are disposed on the left side of the supply port 408 are the same is described in this embodiment. When the number of discharge modules 204 and the number of memory modules 206 are the same or substantially the same, the modules may be efficiently disposed on the substrate $I_1$. Therefore, it is preferable that the modules are alternately arranged on the substrate $I_1$ in the Y direction at the same pitch. Note that the modules may not be alternately arranged, and at least one of the memory modules 206 is disposed between the plurality of discharge modules 204 in the Y direction.

Furthermore, energy required for driving the memory elements is generally smaller than energy required for driving the recording elements Rh, and capability of a driver for the memory element is also lower. Accordingly, an area of the driving elements MD2 for a memory element may be smaller than an area of the driving elements MD1 for a recording element. As illustrated in FIG. 5, a length of the driving elements MD2 for a memory element is preferably smaller than a length of the driving elements MD1 for a recording element in the X direction of the substrate $I_1$ since increase in size of the substrate $I_1$ is suppressed.

According to this embodiment, the recording element arrays 4041_S and 4041_L are provided for discharging different amounts of liquid as described above. Since energy required for driving the recording elements becomes smaller as an amount of discharged liquid becomes smaller, an area of the driving elements MD1_S for a recording element is smaller than an area of the driving elements MD1_L. Therefore, a region on the recording element array 4041_S side more easily ensures a space in which elements and circuits are disposed when compared with a region on the recording element array 4041_L side. In this embodiment, the memory modules 206 are provided in this space, and therefore, increase in size of the substrate $I_1$ may be further suppressed.

As described above, according to this embodiment, the memory modules 206 are disposed near a portion of the recording element array 4041_S among the plurality of recording element arrays 4041_S and 4041_L. Accordingly, this embodiment is advantageous when the number of memory modules 206 is comparatively smaller (half or less, for example) than the number of discharge modules 204 on the entire substrate $I_1$, since a space of the substrate $I_1$ may be efficiently used.

Note that the memory modules 206 may be disposed near all the discharge modules 204 or a number of the discharge modules 204 which discharge a large amount of liquid. Furthermore, at least one of the memory modules 206 is disposed between the recording element array 4041 and the common logic bus line 402, and a number of the memory modules 206 may be disposed out of this region.

Note that the anti-fuse element is used as a memory element in this embodiment. When the anti-fuse element is used, a size of the memory module may be reduced when compared with the poly fuse memory. Furthermore, a gate oxide film formed by a semiconductor fabrication process of a substrate may be used as a gate oxide film forming the anti-fuse element, and the memory elements may be disposed without newly adding a process. Note that the memory element is not limited to the anti-fuse element.

Furthermore, in this embodiment, each of the memory modules 206 includes the resistance elements Rp which are provided to prevent information from being mistakenly written in the anti-fuse element AF as described above. Therefore, if incorrect writing may be avoided by a use condition or another unit, the resistance elements Rp may not be provided. Furthermore, although the recording elements Rh are electro-thermal transducer elements in this embodiment, the present disclosure is not limited to this and piezoelectric elements may be employed, for example.

Second Embodiment

Figure 6A:
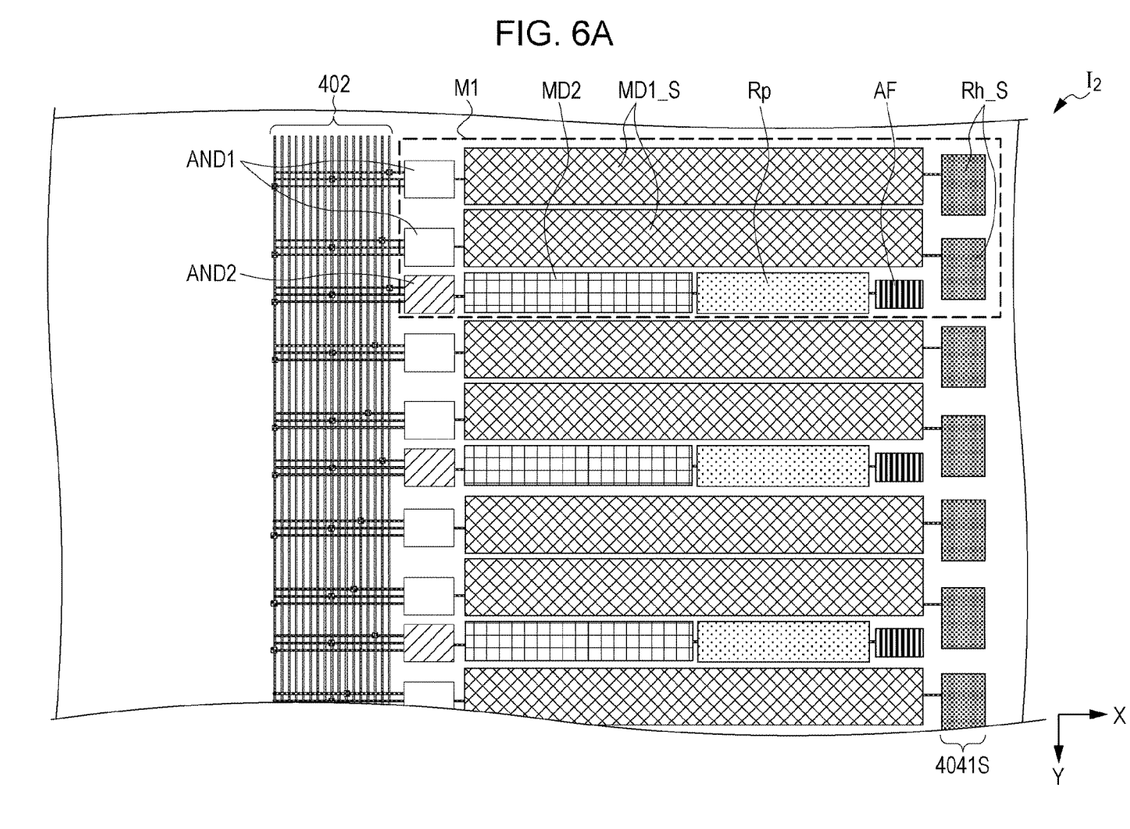
FIGS. 6A, 6B, and 6C are plan views of recording element substrates according to second to fourth embodiments.

FIG. 6A is an enlarged view of a portion of a substrate $I_2$ according to a second embodiment and corresponds to FIG. 5. Descriptions of configurations the same as those of the foregoing embodiment are omitted.

The number of memory modules 206 of this embodiment is smaller than that of the first embodiment, and for example, a ratio between the number of discharge modules 204 and the number of memory modules 206 disposed on a left side of a supply port 408 is 2:1. In this case, a module M1 is formed by a set of two discharge modules 204 and one memory module 206 and the module M1 is repeatedly arranged in a Y direction of the substrate $I_2$. The one module M1 is disposed in a region corresponding to a length of two recording elements Rh_S in the Y direction.

In this way, the arrangement of the discharge modules 204 and the memory module 206 which is repeatedly performed is preferable since a common logic bus line 402 may be shared by the discharge modules 204 and the memory modules 206 while the modules are efficiently arranged.

Third Embodiment

Figure 6B:
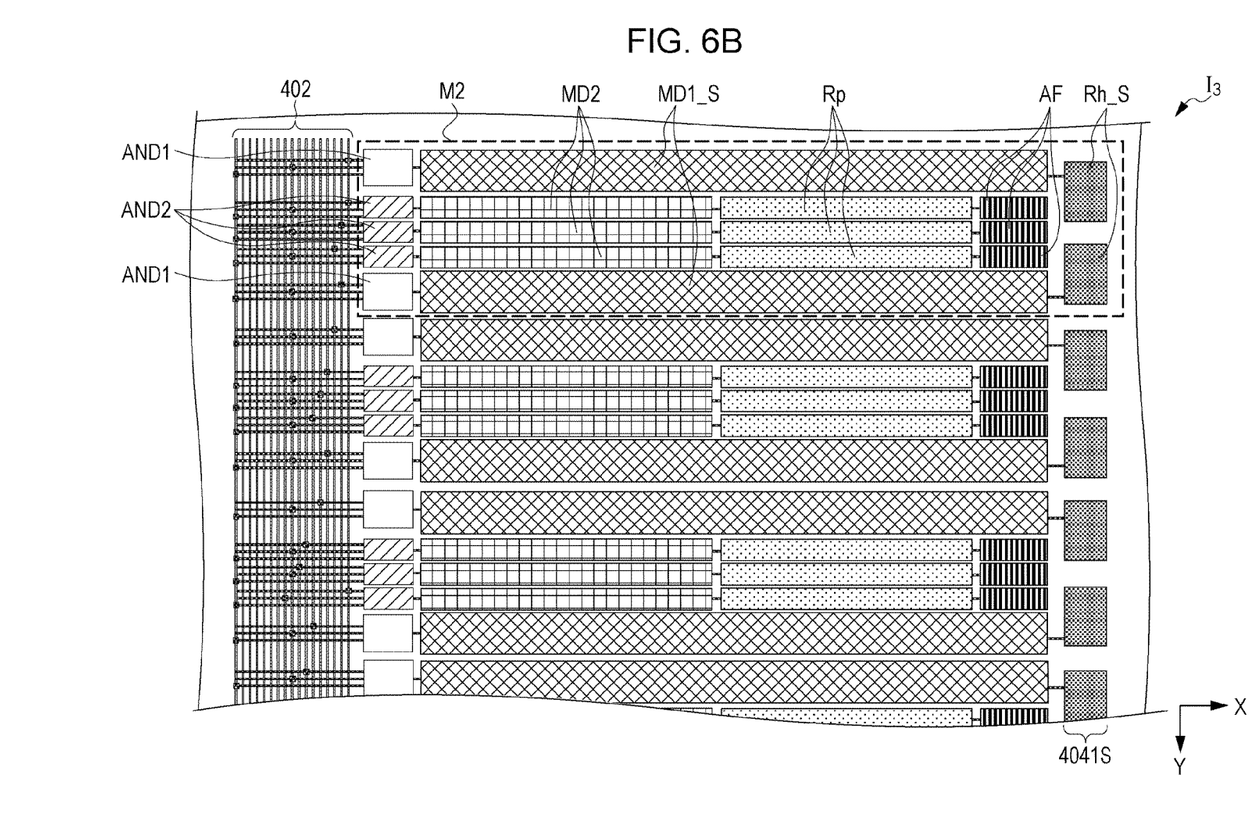

FIG. 6B is an enlarged view of a portion of a substrate $I_3$ according to a third embodiment and corresponds to FIG. 5. Descriptions of configurations the same as those of the foregoing embodiment are omitted.

The number of memory modules 206 of this embodiment is larger than that of the first embodiment, and for example, a ratio between the number of discharge modules 204 and the number of memory modules 206 disposed on a left side of a supply port 408 is 2:3. In this case, a module M2 is formed by a set of two discharge modules 204 and three memory modules 206 and the module M2 is repeatedly arranged in a Y direction of the substrate $I_3$. The one module M2 is disposed in a region corresponding to a length of two recording elements Rh_S in the Y direction.

In this way, the arrangement of the discharge modules 204 and the memory modules 206 which is repeatedly performed is preferable since a common logic bus line 402 may be shared by the discharge modules 204 and the memory modules 206 while the modules are efficiently arranged.

Note that, in the foregoing embodiments and this embodiment, as illustrated in FIG. 5 and FIGS. 6A and 6B, it is preferable that vertical and horizontal sizes of the driving elements MD1 and MD2 are appropriately set depending on the number of memory modules 206 so that the memory modules 206 are efficiently arranged.

Fourth Embodiment

Figure 6C:
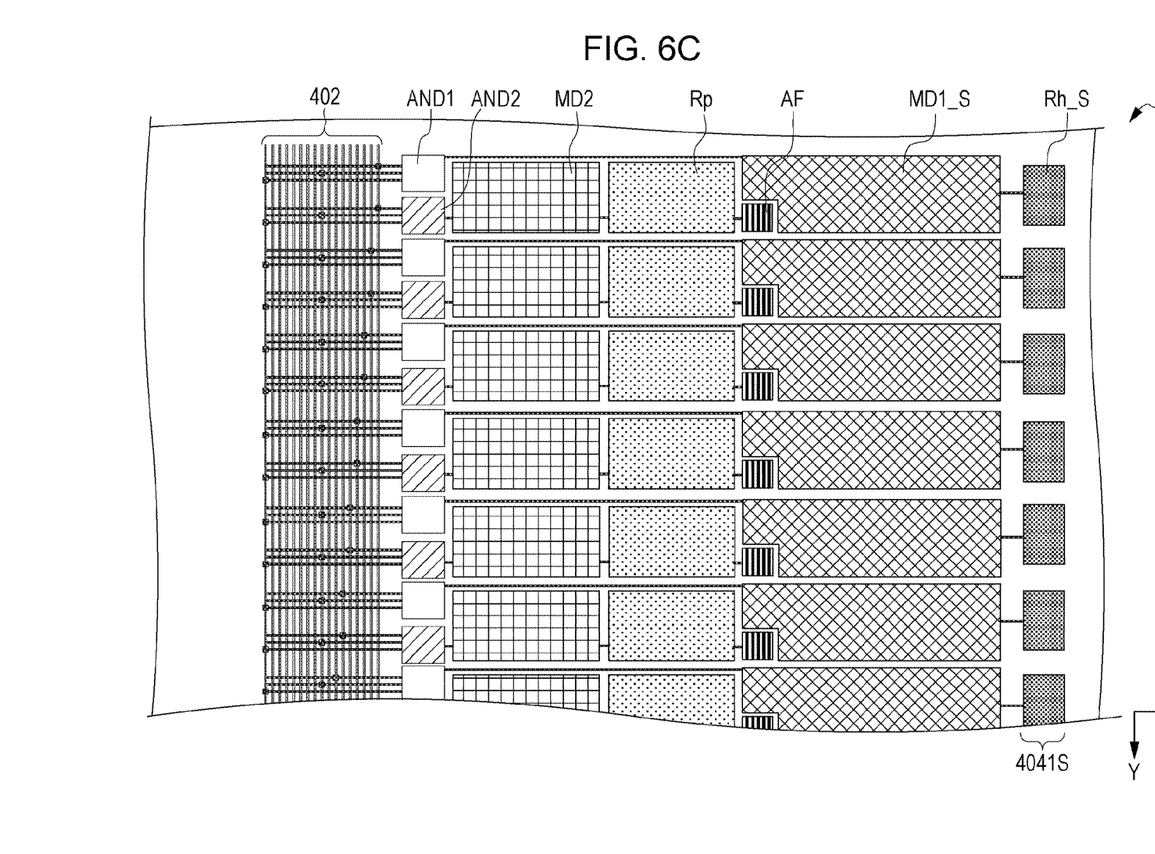

FIG. 6C is an enlarged view of a portion of a substrate $I_4$ according to a fourth embodiment and corresponds to FIG. 5. Descriptions of configurations the same as those of the foregoing embodiment are omitted.

In this embodiment, the number of discharge modules 204 and the number of memory modules 206 which are disposed on a left side of a supply port 408 are equal to each other. Specifically, one discharge module 204 and one memory module 206 are arranged in parallel in an X direction in a region corresponding to a length of one recording element Rh_S in a Y direction. One set of the discharge module 204 and the memory module 206 is repeatedly arranged in the Y direction of the substrate $I_4$.

In this way, the discharge module 204 and the memory module 206 may be disposed in a mixed manner between the recording element array 4041 and the common logic bus line 402.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-031357 filed Feb. 22, 2017, which is hereby incorporated by reference herein in its entirety.

What is claimed is:

1. A recording element substrate comprising:
a recording module including a plurality of recording elements and first logic circuits corresponding to the plurality of recording elements;
a memory module including a plurality of memory elements and second logic circuits corresponding to the plurality of memory elements;
a signal supply circuit configured to supply a signal for controlling the recording elements and a signal for controlling the memory elements; and
a common line configured to connect the signal supply circuit to the plurality of first logic circuits and the plurality of second logic circuits in common,
wherein the recording elements are arranged along an extending direction in which the common line extends, and the memory modules are disposed between the common line and the recording elements.

2. The recording element substrate according to claim 1, wherein the first logic circuits are arranged along the extending direction, and at least one of the second logic circuits is disposed between adjacent first logic circuits in the extending direction.

3. The recording element substrate according to claim 2, wherein at least portions of the first and second logic circuits overlap with each other in the extending direction.

4. The recording element substrate according to claim 1, wherein the recording modules include respective first driving elements which connect the recording elements to the first logic circuits, and
the memory modules include respective second driving elements which connect the memory elements to the second logic circuits.

5. The recording element substrate according to claim 4, wherein an area of the first driving elements is larger than an area of the second driving elements.

6. The recording element substrate according to claim 4, wherein a length of the first driving elements is larger than a length of the second driving elements in a direction which intersects with the extending direction.

7. The recording element substrate according to claim 1, wherein the recording elements include a first recording element array which is an array of first recording elements which discharge a first amount of recording material and a second recording element array which is an array of second recording elements which discharge a second amount of recording material which is larger than the first amount, and the memory modules are disposed between the first recording element array and the common line.

8. The recording element substrate according to claim 7, wherein the recording modules include respective first driving elements which connect the recording elements to the first logic circuits, and
an area of the first driving elements connected to the first recording elements is smaller than an area of the first driving elements connected to the second recording elements.

9. The recording element substrate according to claim 1, wherein the memory elements are anti-fuse elements.

10. The recording element substrate according to claim 1, wherein the signal supply circuit is disposed in an end portion of the recording element substrate in the extending direction.

11. A liquid discharge head comprising:
a recording element substrate including
a recording module including a plurality of recording elements and first logic circuits corresponding to the plurality of recording elements,
a memory module including a plurality of memory elements and second logic circuits corresponding to the plurality of memory elements,
a signal supply circuit configured to supply a signal for controlling the recording elements and a signal for controlling the memory elements, and
a common line configured to connect the signal supply circuit to the plurality of first logic circuits and the plurality of second logic circuits in common, and
a discharge port member including discharge ports corresponding to the recording elements,
wherein the recording elements are arranged along an extending direction in which the common line extends, and the memory modules are disposed between the common line and the recording elements.

12. The liquid discharge head according to claim 11, wherein the first logic circuits are arranged along the extending direction, and at least one of the second logic circuits is disposed between adjacent first logic circuits in the extending direction.

13. The liquid discharge head according to claim 12, wherein at least portions of the first and second logic circuits overlap with each other in the extending direction.

14. The liquid discharge head according to claim 11, wherein the recording modules include respective first driving elements which connect the recording elements to the first logic circuits, and
the memory modules include respective second driving elements which connect the memory elements to the second logic circuits.

15. The liquid discharge head according to claim 14, wherein an area of the first driving elements is larger than an area of the second driving elements.

16. The liquid discharge head according to claim 14, wherein a length of the first driving elements is larger than a length of the second driving elements in a direction which intersects with the extending direction.

17. The liquid discharge head according to claim 11, wherein the recording elements include a first recording element array which is an array of first recording elements which discharge a first amount of recording material and a second recording element array which is an array of second recording elements which discharge a second amount of recording material which is larger than the first amount, and the memory modules are disposed between the first recording element array and the common line.

18. The liquid discharge head according to claim 17, wherein the recording modules include respective first driving elements which connect the recording elements to the first logic circuits, and
an area of the first driving elements connected to the first recording elements is smaller than an area of the first driving elements connected to the second recording elements.

19. The liquid discharge head according to claim 11, wherein the memory elements are anti-fuse elements.

20. A recording apparatus which performs recording using a liquid discharge head comprising:
a recording element substrate including
a recording module including a plurality of recording elements and first logic circuits corresponding to the plurality of recording elements,
a memory module including a plurality of memory elements and second logic circuits corresponding to the plurality of memory elements,
a signal supply circuit configured to supply a signal for controlling the recording elements and a signal for controlling the memory elements, and
a common line configured to connect the signal supply circuit to the plurality of first logic circuits and the plurality of second logic circuits in common, and
a discharge port member including discharge ports corresponding to the recording elements,
wherein the recording elements are arranged along a direction in which the common line extends, and the memory modules are disposed between the common line and the recording elements.

* * * * *